United States Patent [19]

Berger et al.

[11] Patent Number: 5,775,569

[45] Date of Patent: Jul. 7, 1998

[54] METHOD FOR BUILDING INTERCONNECT STRUCTURES BY INJECTION MOLDED SOLDER AND STRUCTURES BUILT

[75] Inventors: Daniel George Berger, Wappingers Falls, N.Y.; Guy Paul Brouillette; David Hirsch Danovitch, both of Quebec, Canada; Peter Alfred Gruber, Mohegan Lake, N.Y.; Rajesh Shankerlal Patel, Fremont, Calif.; Stephen Roux, Purdys, N.Y.; Carlos Juan Sambucetti, Croton-on-Hudson, N.Y.; James Louis Speidell, Poughguag, N.Y.

[73] Assignee: IBM Corporation, N.Y.

[21] Appl. No.: 741,453

[22] Filed: Oct. 31, 1996

[51] Int. Cl.⁶ ............................................. H05K 3/34
[52] U.S. Cl. ...................... 228/254; 228/56.3; 438/613; 438/614
[58] Field of Search .................................. 228/56.3, 253, 228/254, 180.22; 438/613, 614

[56] References Cited

U.S. PATENT DOCUMENTS 5,193,738  3/1993  Hayes ........................................ 228/254
5,244,143  9/1993  Ference et al. ........................... 228/253
5,346,118  9/1994  Degani et al. ............................ 228/254

*Primary Examiner*—Samuel M. Heinrich
*Attorney, Agent, or Firm*—Tung & Associates

[57] ABSTRACT

A method for forming solder bumps on an electronic structure including the steps of first providing a mold made by a sheet of a mold material having a thickness greater than that of the solder bumps to be formed, the mold material has sufficient optical transparency so as to allow the inspection of a solder material subsequently filled into the mold cavities that are formed in the mold material, and a coefficient of thermal expansion that is substantially similar to the substrate which the mold will be mated to, forming a multiplicity of mold cavities in the sheet of mold material, filling the multiplicity of mold cavities with a solder material, cooling the mold to a temperature that is sufficient to solidify the solder material in the multiplicity of mold cavities, positioning the mold intimately with the electronic structure such that the cavities facing the structure, and heating the mold and the structure together to a temperature sufficiently high such that the solder material transfers onto the electronic structure.

16 Claims, 3 Drawing Sheets

METHOD FOR BUILDING INTERCONNECT STRUCTURES BY INJECTION MOLDED SOLDER AND STRUCTURES BUILT

FIELD OF THE INVENTION

The present invention generally relates to a method for building interconnect structures by injection molded solder and more particularly, relates to a method for building interconnect structures by injection molded solder wherein the solder is first injected into mold cavities contained in a mold, cooled and then transferred to a semi-conducting substrate by reflowing the solder and interconnect structures built by such method.

BACKGROUND OF THE INVENTION

In present semiconductor fabrication processes, semiconductor chips are frequently attached to other chips or other electronic structures. The attachment of a semiconductor chip is frequently accomplished by one of two techniques. The first technique is a wire bonding process in which each of a series of I/O bump terminals on a chip built on an aluminum bonding pad is sequentially bonded to the connecting pads on a substrate. The second technique is a flip chip attachment method in which all the I/O bumps on a semiconductor chip are first terminated with a solder material. A frequently used solder material is a lead/tin high melting temperature alloy. The semiconductor chip is then flipped over and the solder bumps are aligned and reflowed in a reflow furnace to effect all the I/O connections with the bonding pads on the substrate. One advantage achieved by the flip chip process is its applicability to very high density CMOS circuits and its high reliability in the interconnects formed when compared to the wire bonding process.

In the more recently developed interconnect technology of C4 (controlled collapse chip connection) which is a method of using a lead-rich lead/tin alloy to mount chips directly to high temperature ceramic substrates, C4 flip chip structures can be built directly over exposed aluminum vias located at the top surface of a wafer. The flip chip structure consists of a ball limiting metallurgy (BLM) and a solder ball/bump. The BLM used is a multi-layer structure such as Cr-Cu-Au which provides a conductive path between solder and the aluminum wiring exposed through vias in the wafer. The BLM structure also seals the vias and thus provides a restricted solderable area such that the wafer surface outside the BLM regions is protected by either a glass or a polymer film to limit the lateral flow of solder during subsequent reflow process. A column structure during chip interconnect can thus be assured.

A typical BLM structure is shown in FIG. 1 which is built on an electronic device 10. In the electronic device 10, a first dielectric layer 12 is deposited on a previously processed IC device and then a window 14 is opened by a photolithographic method and a metal such as tungsten is deposited to form a via or interconnect. After the metal layer is etched back, a second dielectric layer 18 is deposited on top of the first dielectric layer 12 and the metal via 14 by a blanket deposition method. A window 20 is then opened by a photolithographic method such that a conductive metal such as an aluminum-copper alloy can be deposited. After the conductive metal is etched back, layers of dielectric materials such as layer 22 of silicon oxide, layer 24 of silicon nitride and layer 26 of polyimide are sequentially deposited on top of the second dielectric layer 18 and the conductive metal plug 20. A window 28 is then etched away in the dielectric layers 22, 24 and 26 such that an adhesion layer of titanium tungsten 32 may be deposited. Other metallic layers such as those typically used in a ball limiting metallurgy (BLM) construction are then sequentially deposited. This is shown in FIG. 1 by layer 36 of a phased chromium-copper layer wherein a thin chromium layer of approximately 1,000 Å is first evaporated as an adhesion layer and then a thicker layer of chromium-copper of approximately 2,000 Å is deposited on top. A copper layer 38 of approximately 5 microns thickness is then deposited on top of the chromium-copper layer 36. It should be noted, even though not shown in FIG. 1, a very thin layer of gold (Au) is normally deposited on top of the copper layer for improved wettability. Thus, the four metallic layers that typically forms a BLM structure must use a resist to pattern a C4 structure and the photoresist layer must then be stripped and the copper, chromium-copper and titanium tungsten layers etched. A solder layer 42 is then deposited and formed by either an electroplating method or an evaporation method.

As shown in FIG. 1, the most widely used method of fabrication for a C4 structure is by a metal mask technology where both the BLM and the solder are evaporated through holes provided in a metal mask. Even though the same mask is used, the BLM and the solder are deposited in separate evaporators. The solder layer is normally deposited of about 100 micron thickness which requires a deposition time of approximately one hour. When a lead/tin solder is deposited, the lead/tin pool evaporates inhomogeneously due to the higher vapor pressure of lead. A subsequent reflow process is therefore required which is typically conducted in a hydrogen ambient atmosphere. One of the drawbacks of the evaporation process is that only 3% of the total evaporated solder reaches the BLM while the remainder is wasted on the mask and the evaporator walls. The metal masking and evaporation process therefore is not a very efficient solder building process.

An improved process from that of the metal mask/evaporation technique is the use of photolithography and electroplating for depositing solder. In this process, the initial BLM layers are first blanket applied by an evaporation or a sputtering process. A photoresist layer is then applied and patterned to expose the C4 regions of the BLM, which are then electroplated with about 100 microns of solder. The photoresist layer is then removed and the BLM regions is selectively etched using the plated solder bumps as a mask since the bumps are uneffected by the etching solutions. In this method, even though the photolithography which replaces the metal masking process can be operated more efficiently, the plating of the solder bumps is a rather complex process.

Others have used photolithographic process that consists of blanket depositions of BLM layers, photoresist application and patterning, BLM layers sub-etch, photoresist removal and solder deposition processes. The resulting BLM structure resembles that fabricated from a metal mask/evaporation technique and solder can be subsequently evaporated in a similar way. The evaporation of solder used in this process for building bumps decreases process throughput.

Still others have used electroless plating to fabricate BLM layers which is a maskless process that involves an activation of the exposed aluminum surface of the wafer vias for subsequent plating of the desired metallurgy, e.g., nickel-gold. The BLM structure fabricated by this process is compatible with solder evaporation process and not with the electroplating process.

In addition to the electroplating and evaporation techniques for depositing solder, solder dipping, solder ball placement, wire bonding and screening techniques have also been used to build solder bumps on a BLM structure. However, all the techniques involve a fully sequential process where the wafer is implicated from the first to the last step. Therefore, if at any point and specifically if towards the end of the processing steps an irrepairable defect occurs, the wafer and all the related cost incurred to that point would be lost.

Other related technologies include U.S. Pat. No. 5,219,117 which discloses a process for attaching solder balls to silicon wafers by using preformed solder balls which are deposited on the cavities of a silicon mold. The method utilizes preformed solder balls and not bulk solder and therefore requires additional processing steps for forming the solder balls. In another technology developed as disclosed in U.S. Pat. No. 5,388,327, a process for forming a film with holes punctured in it for using as a mold is disclosed. The holes are filled with a solder paste by a screening process and then the film is heated to melt the solder while the film is applied against a wafer and reflowed. Finally, the film is dissolved by a chemical solvent leaving the solder bumps on the wafer. The solder screening process and the process of dissolving the film with a solvent are both time consuming and contaminant producing.

An injection molded solder (IMS) process allows the controlled filling of cavities of a mold with molten solder or solder alloys of any composition. It is accomplished by using an IMS head where the solder is loaded and melted first and then placed tightly against a mold surface and glided across the surface. A vacuum channel is provided ahead of the solder slot such that the mold cavities are under vacuum. Molten solder then runs quickly into the cavities that are under vacuum and filling the cavities. After the cavities are filled and the mold is cooled and inspected, the IMS is ready for transfer to a mating surface on a substrate. In a copending application Docket No. Y0893-0255 assigned to the common assignee of the present invention, the use of vacuum channels and vacuum links to force solder into cavities is disclosed. The copending application is hereby incorporated in its entirety by reference.

The IMS technology is also disclosed in U.S. Pat. No. 5,244,143, assigned to the common assignee of the present invention, which claims an IMS process based on the application of pressure for filling mold cavities in an IMS mold. The patent discloses that by the application of a positive pressure with a nitrogen gas, the filling of the micro-cavities in the mold can be facilitated.

It is therefore an object of the present invention to provide a method for building interconnect structures by injection molded solder that does not have the drawbacks and shortcomings of conventional fabrication technology.

It is another object of the present invention to provide a method for building interconnect structures by injection molded solder that does not require a time consuming deposition technique such as the forming of solder bumps by evaporation.

It is a further object of the present invention to provide a method for building interconnect structures by injection molded solder wherein a solder molding process and a BLM structure building process can be carried out concurrently.

It is another further object of the present invention to provide a method for building interconnect structures by injection molded solder wherein a unique mold structure is utilized.

It is still another object of the present invention to provide a method for building solder bumps on an electronic structure by injection molded solder wherein a substantially transparent mold is utilized to injection mold solder bumps of a predetermined shape.

It is yet another object of the present invention to provide a method for building solder bumps on an electronic structure by injection molded solder wherein a substantially transparent mold is used for the injection molding of solder bumps such that the bumps formed in the mold can be readily inspected after the molding process.

It is still another further object of the present invention to provide a method for building solder bumps on an electronic structure by injection molded solder wherein a substantially transparent mold is utilized to injection mold solder bumps and the coefficient of thermal expansion of the mold material matches substantially that of the electronic structure onto which the bumps are transferred.

It is yet another further object of the present invention to provide a method for building solder bumps on an electronic structure by injection molded solder wherein solder material is first injected into a mold under the assistance of a vacuum or a positive pressure.

It is still another further object of the present invention to provide a method for building solder bumps on an electronic structure by injection molded solder wherein the technology is suitable for use in the fabrication of large solder structures such as those required for ball grid arrays (BGA's) and column grid arrays (CGA's).

SUMMARY OF THE INVENTION

The present invention provides a method for forming solder bumps on an electronic structure by utilizing an inexpensive mold structure that is substantially transparent such that injection molded solder bumps can be readily inspected and further, the mold can be easily aligned with the electronic structure for transferring the bumps onto the structure.

In a preferred embodiment, a method for forming solder bumps on an electronic structure can be carried out by the steps of first providing a mold made of a sheet of a mold material that has a thickness greater than the thickness of the solder bump to be formed wherein the mold material has sufficient optical transparency so as to allow the inspection of any solder material subsequently injected into the mold cavities formed in the material, and a coefficient of thermal expansion that is substantially similar to that of the electronic structure which the mold will be mated to, forming a multiplicity of mold cavities in the sheet of the mold material, filling the multiplicity of mold cavities with a solder material, cooling the mold to a temperature sufficient to solidify the solder material in the cavities, positioning the mold immediately adjacent to the electronic structure with the cavities facing the structure, and heating the mold and the electronic structure to a temperature sufficiently high such that the solder material transfers onto the electronic structure.

In an alternate embodiment, a method for constructing a mold for building interconnect structures by injection molded solder is provided which can be carried out by the steps of first providing a mold material that has a thickness greater than that of an interconnect structure to be built, the mold material has sufficient optical transparency to allow the inspection of any solder material subsequently filled into the mold cavities formed in the material, and a coefficient of thermal expansion substantially similar to that of a substrate that the mold will be mated to, and forming a multiplicity of mold cavities in the mold material.

The present invention is further directed to an electronic structure that has solder bumps built by this method including a semi-conducting substrate and a multiplicity of solder bumps formed on the substrate wherein the bumps are first formed in a mold equipped with a multiplicity of cavities by injecting a solder material into the cavities and then transferred onto a surface of the substrate by positioning the mold immediately adjacent to the substrate and raising the mold temperature sufficiently high so as to cause a flow in the solder material toward the substrate.

The present invention is further directed to a multiplicity of solder bumps formed on a semi-conducting substrate wherein the bumps are first formed in a mold equipped with a multiplicity of cavities by injecting a solder material into the cavities and then transferred onto a surface of the substrate by positioning the mold immediately adjacent to the substrate and raising the mold temperature sufficiently high so as to cause a flow in the solder material toward the substrate.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention provides a method for building interconnect structures on a semiconductor wafer by first utilizing a substantially transparent mold for molding injection molded solder bumps of a predetermined shape and then transferring the solder bumps onto a wafer surface. The method presents several major benefits such as it allows the inspection of the quality of solder bumps molded prior to transferring; it allows an easy alignment process between the mold cavities and the BLM structures on the wafer surface to be carried out; and it allows a mold having a coefficient of thermal expansion substantially similar to that of the semi-conducting wafer to be used such that solder bumps can be accurately placed on the wafer surface.

The present invention method provides novel enhancements to the injection molded solder technology and novel mold construction developments which when combined together provides a technique for transferring a molten solder bump onto a BLM for the fabrication of solder interconnect structures.

The BLM structure used as a component of the present invention method can be a present state of the art BLM technology of tri-layers of chromium/copper/gold or similar composite layers produced by mask processes, or a BLM structure produced by photoprocesses and electroplating technique, or an aluminum/electroless nickel-gold BLM which can be applied by a self-registered, mask-less process. The aluminum/electroless nickel-gold BLM process is a more preferred method for the present invention.

The present invention method utilizes novel extensions of the IMS process to the fabrication of microstructures to achieve full semiconductor wafer C4 features. The process for solder filling of a novel mold structure includes the construction of unique mold materials and design for providing a substantially transparent mold which has a coefficient of thermal expansion matching that of the semiconductor wafer material. This allows an optimized IMS filling, quality control and improved alignment and transfer into a full wafer BLM's. The present invention novel method further provides a parallel process for C4 fabrication by building in one sequence the BLM's either by evaporation or by plating techniques (including electroplating or electroless plating) and a parallel sequence of the IMS filling of the mold, and then merging together a matched wafer and mold for alignment and transfer of the solder bumps in the mold onto the wafer BLM's.

Figure 1:
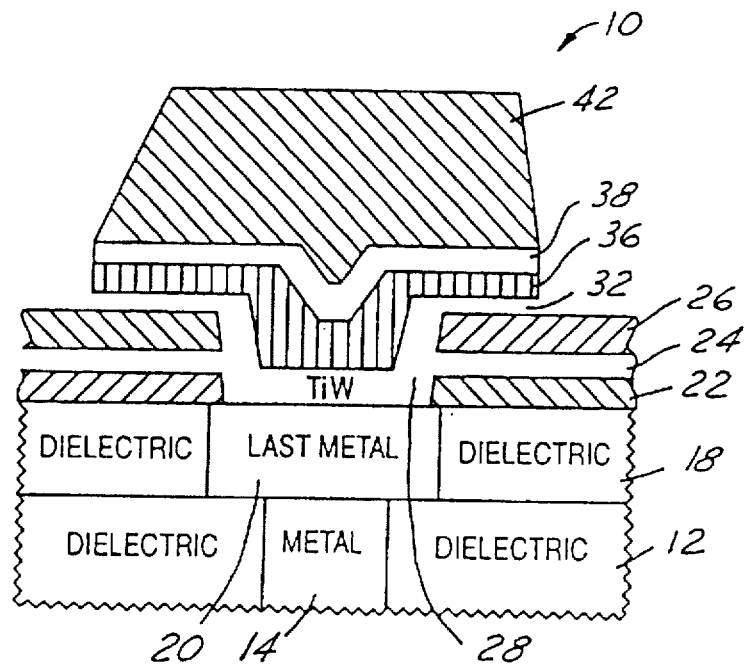
FIG. 1 is an enlarged, partial cross-sectional view of a conventional electronic device that has a BLM structure and an evaporated solder ball formed on top.
Figure 2:
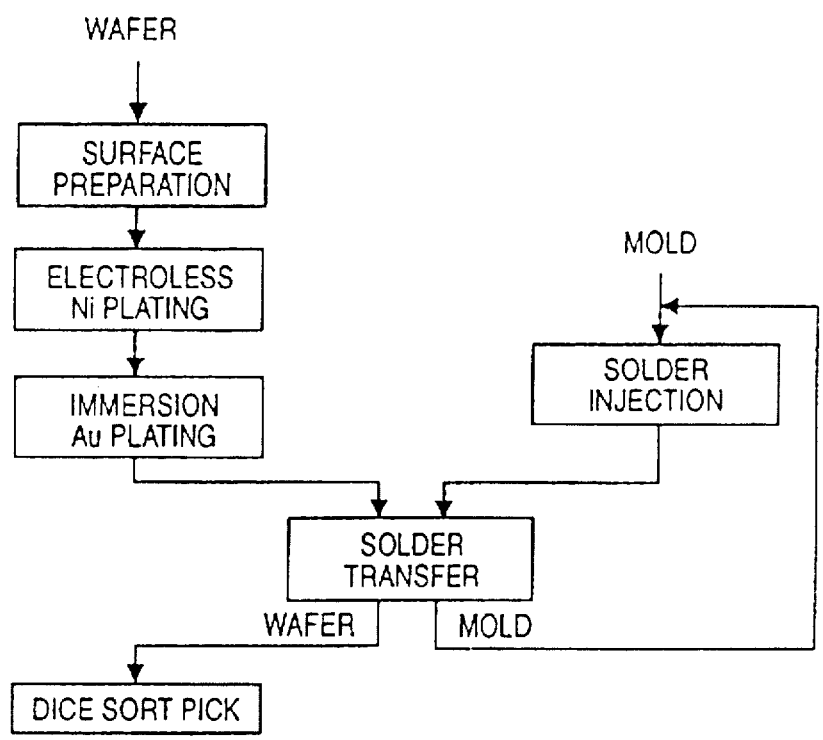
FIG. 2 is a flow chart illustrating the present invention parallel processing of a BLM structure and IMS formation.

Referring now to FIG. 2 where a flow chart illustrating the present invention method is shown. The novel features of parallel processing for C4 fabrication is shown by the wafer processing on the left and the IMS processing on the right. On the wafer processing side, the wafer is first prepared by a surface cleaning procedure such as that carried out by wet etching in a cleaning solution. The cleaned wafer surface is then plated with nickel in an electroless process and then immersed in a gold plating tank for forming the BLM structure. On the right, a mold is first provided and then a solder material is injected into the mold cavities under the assist of vacuum to fill the cavities. After the solder material is cooled in the mold it is brought to the wafer and positioned juxtaposed to the wafer surface with the cavities facing the surface. The solder transfer process then occurs at a solder reflow temperature to place the solder bumps on a wafer which is then diced and sorted, while the empty mold is returned to the injection molding station for the next cycle solder injection.

The IMS technology utilized in the present invention for C4 mold structure is compatible with a large variety of mold materials. One of the criteria for selecting a suitable mold material is the requirement that a C4-sized mold structure can be easily inspected and transferred onto large wafers (i.e., 8-inch wafers) in a cost effective manner. Other criteria for the selection of a suitable mold material are characteristics of the mold material that provides a visual contrast with respect to a solidified solder alloy in order to facilitate solder quality inspection, that provides transparency to facilitate both solder quality inspection and mold-to-wafer alignment, and that provides a coefficient of thermal expansion (CTE) which matches that of the wafer to enable mold-to-wafer alignment, to maximize self-alignment during reflow of solder from the mold to the wafer BLM, and to minimize post-reflow stress imposed by the mold on the solder/BLM structure.

Several mold constructions and their associated transfer techniques of solder have been investigated and are described in the following example.

EXAMPLE

Figure 3:
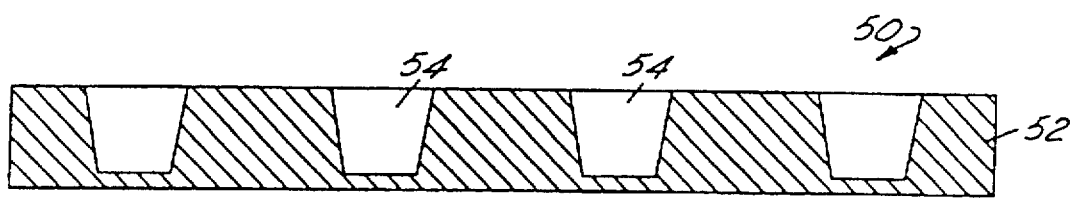
FIG. 3 is an enlarged, cross-sectional view of a glass mold for the present invention IMS process.

A glass mold 50, shown in FIG. 3, is constructed of a glass plate 52 which has blind hole cavities 54 created by a chemical etching process of the glass. The blind hole cavities 54 are etched through openings in a thin film that was previously deposited and patterned on the glass plate 52. The thin film and the chemical etchant are each chosen such that the selectivity of the etchant for the glass material versus the thin film material is maximized. After the chemical etching process is completed, the thin film is removed by an appropriate chemical solvent. Suitable glass materials include but not limited to boro-silicate glass or Pyrex glass which has a coefficient of thermal expansion (CTE) similar to that of silicon. For instance, the CTE of boro-silicate glass is 3.9 (ppm/k), while the CTE for silicon is 3 (ppm/k). When a GaAs substrate is used in place of Si, a soda-lime glass can be suitably used since it has a CTE close to that of GaAs.

To effect a solder transfer process, a solder-filled mold can be first aligned to a wafer and then pressure can be applied by weights, clamps or other mechanical means while heat is applied. After transfer occurs at a reflow temperature, the mold is removed. If necessary, the wafer can be subsequently reflowed to achieve solders of a spherical shape and to perfect the BLM to solder bond. Depending on the thickness and the flatness of the glass plate 52, the mechanical pressure applied may not be necessary.

Figure 4:
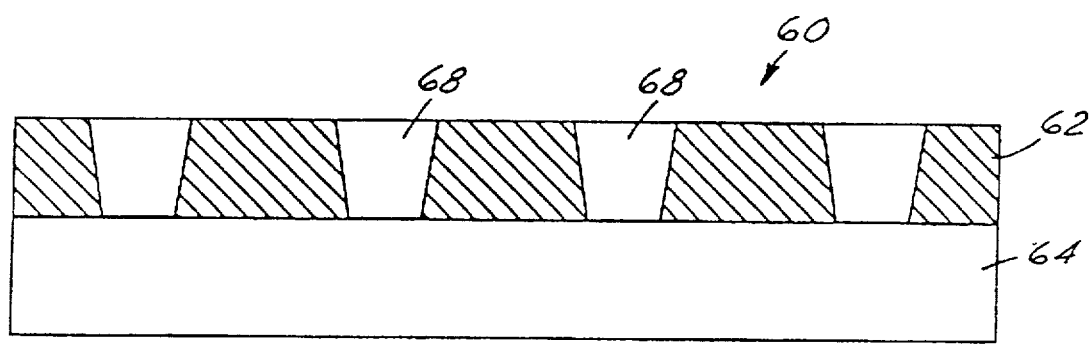
FIG. 4 is an enlarged, cross-sectional view of a polyimide/glass mold for the present invention IMS process.

A different mold construction of a polymer/glass combination is shown in FIG. 4. Mold 60 is constructed by depositing polyimide film 62 on glass plate 64. Techniques that can be suitably used to deposit polyimide film can be spin coating, extrusion, lamination or any other suitable processes. The only requirement is that the polymer film should be applied with a substantially uniform thickness such that it is compatible with the IMS and the solder transfer processes. The polyimide film 62 is subsequently laser ablated through holes in a metal or a glass-metal mask. The polyimide film is etched through its entire thickness to form cavities 68. After the mold cavities 68 are filled (not shown), the mold is transferred to a wafer and pressed tightly against a wafer surface such that solder transfers at a reflow temperature of the solder. The CTE of polyimide film 62 need not necessarily be matched to the wafer provided that a glass to polyimide thickness ratio is maintained sufficiently high and further, that stress induced glass warpage is either compensated for in subsequent processing or eliminated by polyimide deposition on both sides of the glass plate 64.

Still other mold materials can be utilized in the present invention method. For instance, a transparent to semi-transparent, low CTE polyimide film of approximately 0.005" thickness that has blind hole cavities created by a laser ablation technique through a metal or a glass-metal mask. The polyimide material used includes such materials as BPDA/ODA ( poly/pyromellitic dianhydride-oxyaniline) which has a CTE that is close to that of silicon; or BPDA/ODA (poly/byphenyldianhydride-p-phenylenediamine) which has a CTE close to that of GaAs.

Other mold materials such as metal can also be used in the form of a thin, low CTE metal plate that has blind hole cavities created by chemical etching of the metal using a photolithographic method similar to that used for the glass mold. The metal materials that can be suitably used include but are not limited to molybdenum which has a CTE of 17 (ppm/k) close to that of GaAs. To compensate for the opaqueness of the metal plate, non-functional through-holes are etched into the metal plate in areas corresponding to non-functional sites on the periphery of the wafer. The alignment of the opaque metal plate to the wafer can thus be facilitated. After the metal plate is filled with solder material, the solder can be transferred to a wafer in a similar manner as that used for the glass molds.

Figure 5:
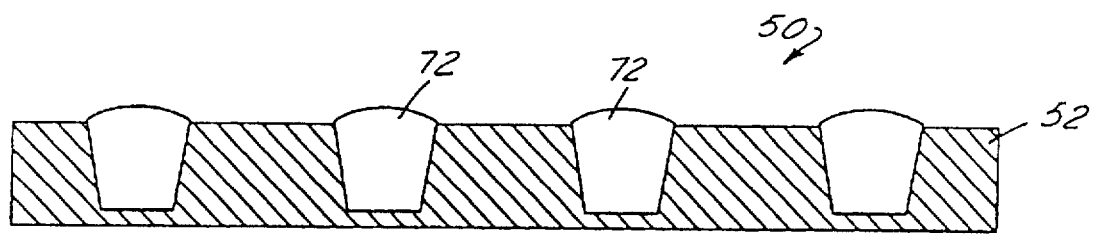
FIG. 5 is an enlarged, cross-sectional view of the glass mold of FIG. 3 filled with an IMS material.

FIG. 5 is an enlarged, cross-sectional view of the glass mold shown in FIG. 3 filled with an IMS material 72. It has been discovered that a suitable solder material for use in the IMS process includes those that contain lead and those do not contain lead. For instance, the lead-containing solder includes 97/3 Pb/Sn, 63/37 Sn/Pb, 90/10 Pb/Sn and 95/5 Pb/Sn or any other suitable lead containing solders. The non-lead-containing solders include those of Sn/Au, SnBi, SnAg, SnSb and SnAgCu.

Figure 6:
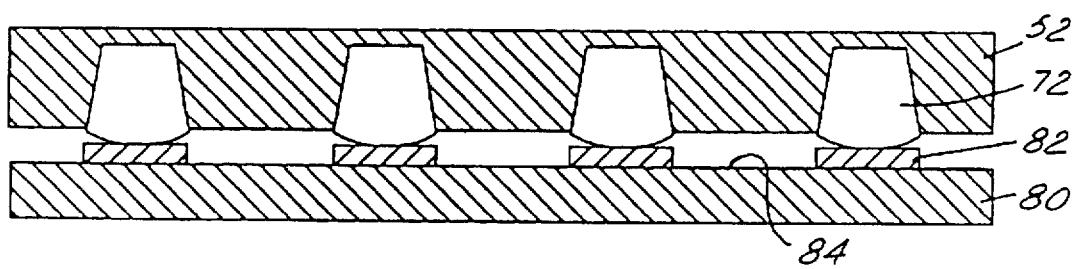
FIG. 6 is an enlarged, cross-sectional view of a filled IMS mold positioned on top of an electronic device equipped with BLM structures.

In the next step of the process, as shown in FIG. 6, the IMS filled mold 52 is flipped over and positioned on an electronic structure such as a semiconductor wafer 80 having BLM structures 82 built on the top surface 84 of the wafer. The mold 52 and the wafer 80 are placed together intimately such that the IMS 72 are in intimate contact with the BLM structures 82. The combined mold/wafer structure is then subjected to a reflow temperature of the solder to cause a flow in the solder toward the BLM structures. For instance, a suitable reflow temperature which is dependent on different solder materials is 360° C. for a high temperature solder and 230° C. for an eutectic solder.

Figure 7:
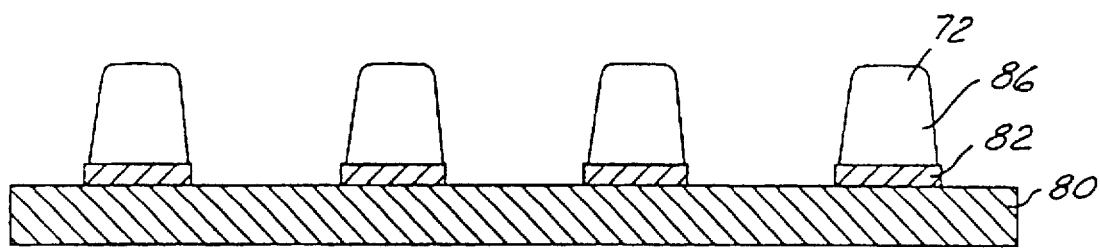
FIG. 7 is an enlarged, cross-sectional view of the electronic structure shown in FIG. 6 with the IMS transferred on top.
Figure 8:
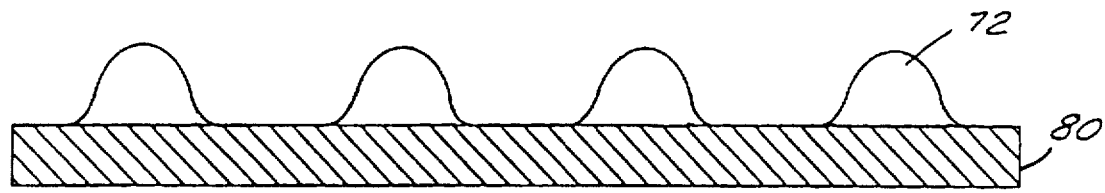
FIG. 8 is an enlarged, cross-sectional view of the solder bumps and the BLM structures shown in FIG. 7 after a reflow process.

FIG. 7 shows the electronic structure 80 after the reflow or the transfer process for the solder bumps 72 is conducted and the mold 52 is removed. It is seen that solder bumps 72 while transferred to the BLM structures 82 retain substantially its shape of the mold cavities in mold 52. While a transparent or a semi-transparent mold enables fairly accurate alignment between the mold and the wafer, some mis-alignment between the solder bumps 72 and the BLM structures 82 may nevertheless occur. It is therefore desirable to conduct a second reflow process at a temperature similar to that used in the first reflow/transfer process for the solder bumps. This is shown in FIG. 8. After the second reflow process, the height of the solder bumps 72 may be slightly reduced while the base 86 of the solder bumps 72 is integrated with the BLM bumps 82 into a substantially uniform metal structure.

The present invention method of forming solder bumps by injection molded solder and BLM structures on a wafer is therefore sufficiently demonstrated by the above descriptions. It is seen that by using the present invention novel transparent or semi-transparent mold major processing benefits can be achieved. First, the solder bumps formed in the mold cavities can be pre-inspected for quality control prior to being transferred to an electronic structure. Secondly, the transparent feature of the mold allows an accurate alignment between the mold and the electronic structure such that solder bumps can be precisely placed on top of BLM structures. Thirdly, since the mold is constructed of a material that has a coefficient of thermal expansion similar to that of the electronic structure to be mated to, i.e., either a silicon or a GaAs, the alignment between the mold and the electronic structure is not disturbed due to a change occurred in the processing temperature.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows:

1. A method of forming solder bumps on an electronic structure comprising the steps of:

providing a mold made by a sheet of a mold material having a thickness greater than that of the solder bumps to be formed, said mold material having sufficient optical transparency so as to allow the inspection of a solder material subsequently filled into mold cavities formed in said material, and a coefficient of thermal expansion substantially similar to that of a substrate that the mold will be mated to, forming a multiplicity of mold cavities in said sheet of mold material, filling said multiplicity of mold cavities with a solder material, cooling said mold to a temperature sufficient to solidify said solder material in said multiplicity of mold cavities, positioning said mold juxtaposed to and aligning with said electronic structure with said multiplicity of mold cavities facing said structure, and heating said mold and said electronic structure together to a temperature sufficiently high such that said solder material transfers onto said electronic structure.

2. A method according to claim 1, wherein said electronic structure is a semiconducting wafer.

3. A method according to claim 1, wherein said electronic structure is made of Si or GaAs.

4. A method according to claim 1, wherein said coefficient of thermal expansion (CTE) of said mold material deviates from the CTE of said electronic structure by less than 20%.

5. A method according to claim 1, wherein said multiplicity of mold cavities is equal to the number of solder bumps to be formed on said electronic device.

6. A method according to claim 1, wherein said multiplicity of mold cavities are filled with said solder material by a technique wherein a differential pressure existed between the mold cavities and the ambient.

7. A method according to claim 1, wherein said multiplicity of mold cavities are filled with said solder material by first drawing vacuum in said cavities.

8. A method according to claim 1, wherein said multiplicity of mold cavities are filled with said solder material by an injection molding technique.

9. A method according to claim 1, wherein said solder material is selected from the group consisting Pb/Sn, Sn/Au, SnBi, SnAg, SnSb and SnAgCu.

10. A method according to claim 1, wherein said solder material contains Sn and Pb.

11. A method according to claim 1 further comprising the step of providing ball limiting metallurgy (BLM) on said electronic structure as bonding pads for said solder bumps.

12. A method according to claim 11, wherein said ball limiting metallurgy is a multi-layer structure comprising Cr-Cu-Au.

13. A method according to claim 11, wherein said ball limiting metallurgy is provided by a technique selected from the group consisting of evaporation, electroplating and self-aligning electroless plating.

14. A method according to claim 1, wherein said mold material is selected from the group consisting of a polymer, a glass, a polymer/glass laminate and a metal.

15. A method according to claim 1, wherein said mold material is polyimide or polyimide/glass laminate.

16. A method according to claim 1, wherein said multiplicity of mold cavities are formed by a laser ablation technique.

* * * * *